US008560308B2

(12) United States Patent
Endo et al.

(10) Patent No.: US 8,560,308 B2
(45) Date of Patent: Oct. 15, 2013

(54) SPEECH SOUND ENHANCEMENT DEVICE UTILIZING RATIO OF THE AMBIENT TO BACKGROUND NOISE

(75) Inventors: Kaori Endo, Kawasaki (JP); Yasuji Ota, Kawasaki (JP); Takeshi Otani, Kawasaki (JP); Taro Togawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1154 days.

(21) Appl. No.: 12/382,905

(22) Filed: Mar. 26, 2009

(65) Prior Publication Data
US 2010/0004927 A1    Jan. 7, 2010

(30) Foreign Application Priority Data

Jul. 2, 2008 (JP) ................................. 2008-174016

(51) Int. Cl.
*G10L 21/02* (2013.01)
*G10L 25/78* (2013.01)
*G10L 15/20* (2006.01)

(52) U.S. Cl.
CPC ............ *G01L 21/0208* (2013.01); *G10L 25/78* (2013.01); *G10L 15/20* (2013.01)
USPC ....................................................... 704/226

(58) Field of Classification Search
CPC ................................................. G10L 21/0208
USPC ....................................................... 704/226
See application file for complete search history.

(56) References Cited

U.S. PATENT DOCUMENTS

| 4,630,305 A | 12/1986 | Borth et al. |
| 2005/0015252 A1 | 1/2005 | Marumoto |
| 2005/0240401 A1 | 10/2005 | Ebenezer |

FOREIGN PATENT DOCUMENTS

| JP | 2000-349893 | 12/2000 |
| JP | 2004-289614 | 10/2004 |
| JP | 2005-37650 | 2/2005 |

OTHER PUBLICATIONS

N. Westerlund et al., "Speech Enhancement using an adaptive gain equalizer with Frequency Dependent Parameter Settings", 2004 IEEE 60th Vehicular Technology Conference, Sep. 26-29, 2004, Los Angeles, California, vol. 5, pp. 3718-3722.
European Search Report mailed Jun. 30, 2009 and issued in corresponding European Patent Application 09004246.6.
Japanese Office Action issued Jun. 12, 2012 in corresponding Japanese Patent Application No. 2008-174016.

*Primary Examiner* — David R Hudspeth
*Assistant Examiner* — Farzad Kazeminezhad
(74) *Attorney, Agent, or Firm* — Staas & Halsey LLP

(57) ABSTRACT

A disclosed speech sound enhancement device includes an SNR calculation unit for calculating an SNR which is a ratio of received speech sound to ambient noise; a first-frequency-range enhancement magnitude calculation unit for calculating, based on the SNR and frequency-range division information indicating a first and a second frequency range, enhancement magnitude of the first frequency range, the first frequency range contributing to an improvement of subjective intelligibility of the received speech sound, the second frequency range contributing to an improvement of subjective articulation of the received speech sound; a second-frequency-range enhancement magnitude calculation unit for calculating enhancement magnitude of the second frequency range based on the enhancement magnitude of the first frequency range; and a spectrum processing unit for processing spectra of the received speech sound using the enhancement magnitude of the first frequency range, the enhancement magnitude of the second frequency range and the frequency-range division information.

14 Claims, 10 Drawing Sheets

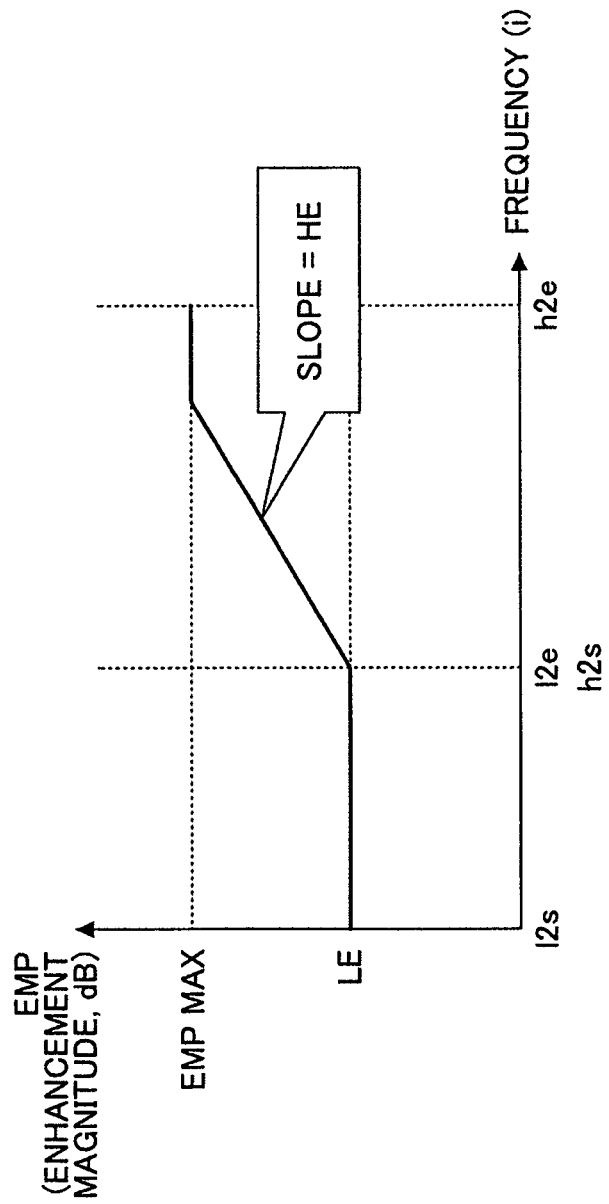

SPEECH SOUND ENHANCEMENT DEVICE UTILIZING RATIO OF THE AMBIENT TO BACKGROUND NOISE

CROSS-REFERENCE TO RELATED APPLICATIONS

This application is based upon and claims the benefit of priority of Japanese Patent Application 2008-174016, filed on Jul. 2, 2008, the entire contents of which are hereby incorporated herein by reference.

FIELD

The present disclosure is directed to an audio signal enhancement scheme and an audio signal enhancement device capable of preventing received speech sound from being indiscernible in the case where a user is talking on a speech transmission system in an environment where the ambient noise is loud. Specifically, the audio signal enhancement scheme and device enhance the received speech sound so that the user is able to readily hear the received speech sound.

BACKGROUND

Known existing speech sound enhancement processes include a technology for using characteristics of audio signals and enhancing formants, which are multiple spectral peaks of received speech sound and influence vowel identification, in accordance with the level of ambient noise (see Patent Document 1, for example), and a technology enhancing received speech sound according to the SNR of the received speech sound and the ambient noise (e.g. Patent Document 2).

[Patent Document 1] Japanese Patent Publication No. 4018571

[Patent Document 2] Japanese Laid-open Patent Application Publication No. 2000-349893

However, in the case where the received speech sound is enhanced according to the above conventional technology (Patent Document 1 or 2), the balance between the low frequency range and the high frequency range is lost, and the enhanced sound becomes muffled (a low frequency component is excessively dominant) or becomes shrill (a high frequency component is excessively dominant). Thus, the conventional technologies leave the problem that their enhancement is subject to a reduction in speech sound quality and is not sufficient to make the received speech sound clear.

SUMMARY

One aspect of the present disclosure may be a speech sound enhancement device including an SNR calculation unit configured to calculate an SNR which is a ratio of received speech sound to ambient noise; a first-frequency-range enhancement magnitude calculation unit configured to calculate, based on the SNR and frequency-range division information indicating a first frequency range and a second frequency range, enhancement magnitude of the first frequency range in a case of the received speech sound being masked by the ambient noise, the first frequency range being preliminarily obtained and contributing to an improvement of subjective intelligibility of the received speech sound, the second frequency range being preliminarily obtained and contributing to an improvement of subjective articulation of the received speech sound; a second-frequency-range enhancement magnitude calculation unit configured to calculate enhancement magnitude of the second frequency range based on the enhancement magnitude of the first frequency range; and a spectrum processing unit configured to process spectra of the received speech sound using the enhancement magnitude of the first frequency range, the enhancement magnitude of the second frequency range and the frequency-range division information.

According to the above structure, the following operations are performed: the SNR calculation unit calculates the degree of the indiscernibility of the received speech sound based on the received speech sound and ambient noise; the first-frequency-range enhancement magnitude calculation unit calculates the first-frequency-range enhancement magnitude used for sufficiently improving the subjective intelligibility of the received speech sound; the second-frequency-range enhancement magnitude calculation unit calculates the second-frequency-range enhancement magnitude used for ensuring that the articulation of speech sound after the first frequency range of the received speech sound is enhanced is sufficiently maintained; and the spectrum processing unit calculates spectra of enhanced speech sound by performing an enhancement process on each frequency range using the first-frequency-range enhancement magnitude and the second-frequency-range enhancement magnitude.

The object and advantages of the disclosure will be realized and attained by means of the elements and combinations particularly pointed out in the claims.

It is to be understood that both the foregoing general description and the following detailed description are exemplary and explanatory and are not restrictive of the present disclosure as claimed.

BRIEF DESCRIPTION OF DRAWINGS

FIG. 10 is a specific example 2 of a graph used for calculating enhancement magnitude of each frequency range.

DESCRIPTION OF EMBODIMENT

Embodiments that describe the best mode for carrying out the present invention are explained next with reference to the drawings.

First Embodiment

Figure 1:
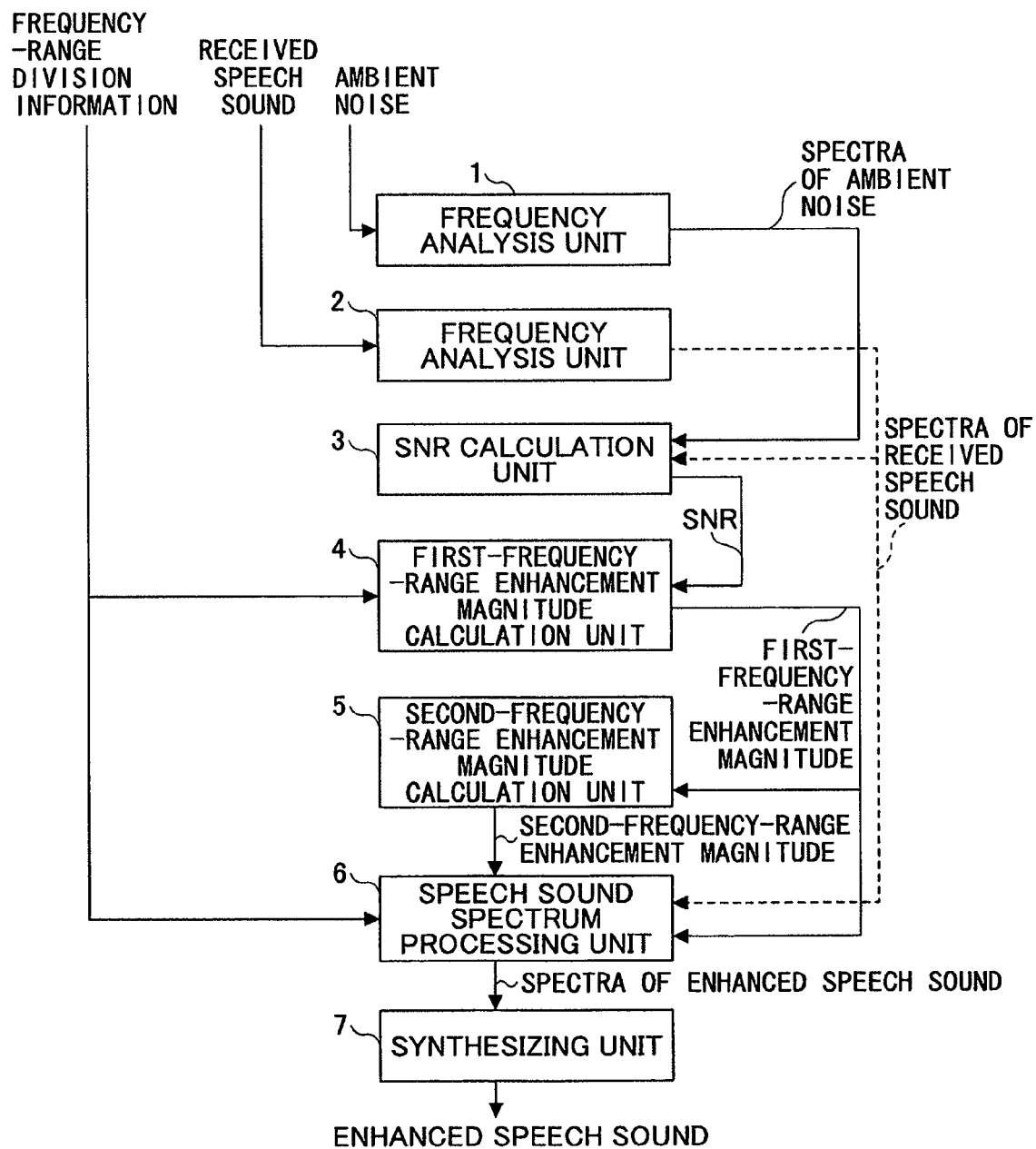
FIG. 1 is an illustration of the first embodiment of the present disclosure.

FIG. 1 is an illustration showing a structure of the first embodiment of the present disclosure. Reference numerals 1 and 2 denote frequency analysis units; reference numeral 3 denotes an SNR calculation unit; reference numeral 4 denotes a first-frequency-range enhancement magnitude calculation unit; reference numeral 5 denotes a second-frequency-range enhancement magnitude calculation unit; reference numeral 6 denotes a speech sound spectrum processing unit; and reference numeral 7 is a synthesizing unit.

The structure illustrated in FIG. 1 is explained next according to an audio signal process. The detailed operation of each structural component is described later.

First, the frequency analysis unit 1 inputs ambient noise, and outputs spectra of the ambient noise.

The frequency analysis unit 2 inputs received speech sound, and outputs spectra of the received speech sound.

The SNR calculation unit 3 inputs the spectra of the ambient noise and the spectra of the received speech sound from the frequency analysis units 1 and 2, respectively, and calculates and outputs an SNR.

The first-frequency-range enhancement magnitude calculation unit 4 receives the SNR output from the SNR calculation unit and frequency-range division information, which indicates a preliminarily-obtained frequency range contributing to an improvement of the subjective intelligibility of the received speech sound and a preliminarily-obtained frequency range contributing to an improvement of the subjective articulation of the received speech sound. Then, the first-frequency-range enhancement magnitude calculation unit 4 calculates enhancement magnitude applied to the frequency range contributing to the improvement of the subjective intelligibility of the received speech sound and outputs it as first-frequency-range enhancement magnitude.

The second-frequency-range enhancement magnitude calculation unit 5 inputs the first-frequency-range enhancement magnitude, and calculates enhancement magnitude applied to the frequency range contributing to the improvement of the subjective articulation of the received speech sound and outputs it as second-frequency-range enhancement magnitude.

The speech sound spectrum processing unit 6 inputs the frequency-range division information, the first-frequency-range enhancement magnitude and the second-frequency-range enhancement magnitude, and outputs spectra of enhanced speech sound.

The synthesizing unit 7 inputs the spectra of enhanced speech sound output from the speech sound spectrum processing unit 6, and outputs enhanced speech sound.

According to the above processing flow, the process for enhancing the received speech sound is performed.

The following describes a detailed processing operation of each structural component.

Frequency Analysis Units 1 and 2

The frequency analysis unit 1 uses ambient noise as an input signal and calculates spectra of the ambient noise using a time-frequency transform process, such as the Fourier transform method. The frequency analysis unit 2 uses received speech sound as an input signal and calculates spectra of the received speech sound using a time-frequency transform process, such as the Fourier transform method.

SNR Calculation Unit 3

The SNR calculation unit 3 calculates an SNR by the following equation using the input spectra of the ambient noise (ambient noise components (N) for respective frequencies) and the input spectra of the speech sound (received speech sound components (S) for respective frequencies).

$$SNR(i)=S(i)-N(i),$$

where i is the frequency index (which indicates a number of a frequency range (i.e. frequency component) used in the time-frequency transform);

SNR(i) is the SNR of the i-th frequency component (dB);

S(i) is the magnitude of a received speech sound component in the i-th frequency component (dB); and N(i) is the magnitude of an ambient noise component in the i-th frequency component (dB).

Note that, in the SNR calculation, an effect of subjective magnitude of sound that changes with respect to each frequency may be introduced.

Specifically, the calculated SNR is corrected by multiplying it by a coefficient representing the subjective magnitude of a specific frequency. The coefficient representing the subjective magnitude of a specific frequency is calculated using existing information, such as an equal-loudness curve.

First-Frequency-Range Enhancement Magnitude Calculation Unit 4

The first-frequency-range enhancement magnitude calculation unit 4 receives the SNR output from the SNR calculation unit and frequency-range division information, which indicates a preliminarily-obtained frequency range contributing to an improvement of the subjective intelligibility of the received speech sound and a preliminarily-obtained frequency range contributing to an improvement of the subjective articulation of the received speech sound, and calculates first-frequency-range enhancement magnitude according to the following process.

(1) An average SNR of the first frequency range is calculated.

$$LSNR = \frac{1}{le - ls + 1} \sum_{i=ls}^{le} SNR(i) \quad \text{[Equation 1]}$$

LSNR: the average SNR of the first frequency range (dB)

i: the frequency index

SNR(i): the SNR of the i-th frequency component (dB)

ls: the lower limit frequency index of the first frequency range le: the upper limit frequency index of the first frequency range "ls" and "le" are calculated as below using the frequency-range division information (a boundary frequency index $I_b$ between the low frequency range and the high frequency range) and the frequency range width of the input signal.

ls=the lower limit frequency index of the frequency range width of the input signal $$le=I_b$$

(2) The average SNR of the first frequency range is applied to an enhancement magnitude graph, thereby obtaining the first-frequency-range enhancement magnitude.

Figure 6:
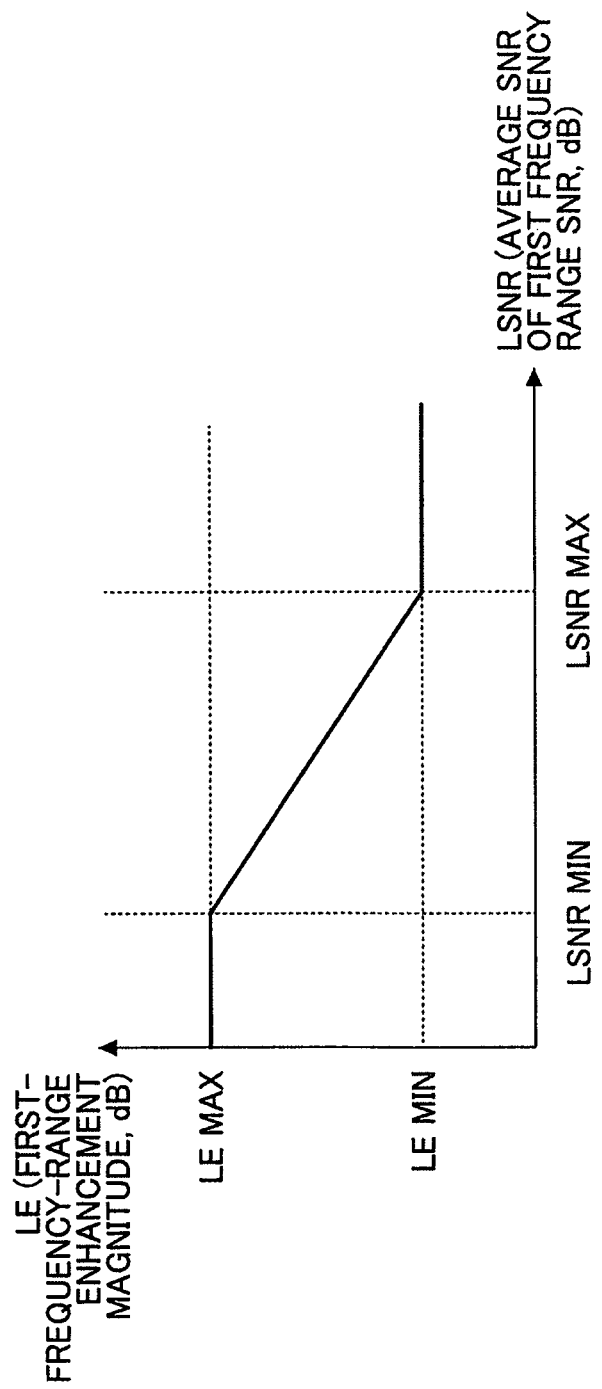
FIG. 6 is a graph for calculating a first-frequency-range enhancement magnitude.

The enhancement magnitude graph of the first frequency range is illustrated in FIG. 6.

LE: the first-frequency-range enhancement magnitude (dB)

LSNR: the average SNR of the first frequency range (dB)

LE MAX: the upper limit of the first-frequency-range enhancement magnitude (dB)

LE MIN: the lower limit of the first-frequency-range enhancement magnitude (dB)

LSNR MAX: the average SNR of the first frequency range at which the lower limit of the first-frequency-range enhancement magnitude is obtained (dB)

LSNR MIN: the average SNR of the first frequency range at which the upper limit of the first-frequency-range enhancement magnitude is obtained (dB)

The possible range of each parameter of the graph is as follows.

LE MAX: 0 to 50 dB, the upper limit provided so that the enhancement of the first frequency range does not exceed the maximum level if the average SNR of the first frequency range is equal to or less than a predetermined value.

LE MIN: 0 to 10 dB, the lower limit provided so that the enhancement of the first frequency range does not fall short of the minimum level if the average SNR of the first frequency range is equal to or more than a predetermined value.

Note that LE MAX must be larger than LE MIN (LE MIN<LE MAX).

LSNR MAX: 0 to 50 dB, the maximum average SNR of the first frequency range with which it is considered to be appropriate to set the first-frequency-range enhancement magnitude to the minimum level since the speech sound is greater than the near-end noise in the first frequency range.

LSNR MIN: −50 to 50 dB, the minimum average SNR of the first frequency range with which it is considered to be appropriate to set the first-frequency-range enhancement magnitude to the maximum level since the speech sound is less than the near-end noise in the first frequency range.

Note that LSNR MAX must be larger than LSNR MIN (LSNR MIN<LSNR MAX).

Second-Frequency-Range Enhancement Magnitude Calculation Unit 5

Figure 7:
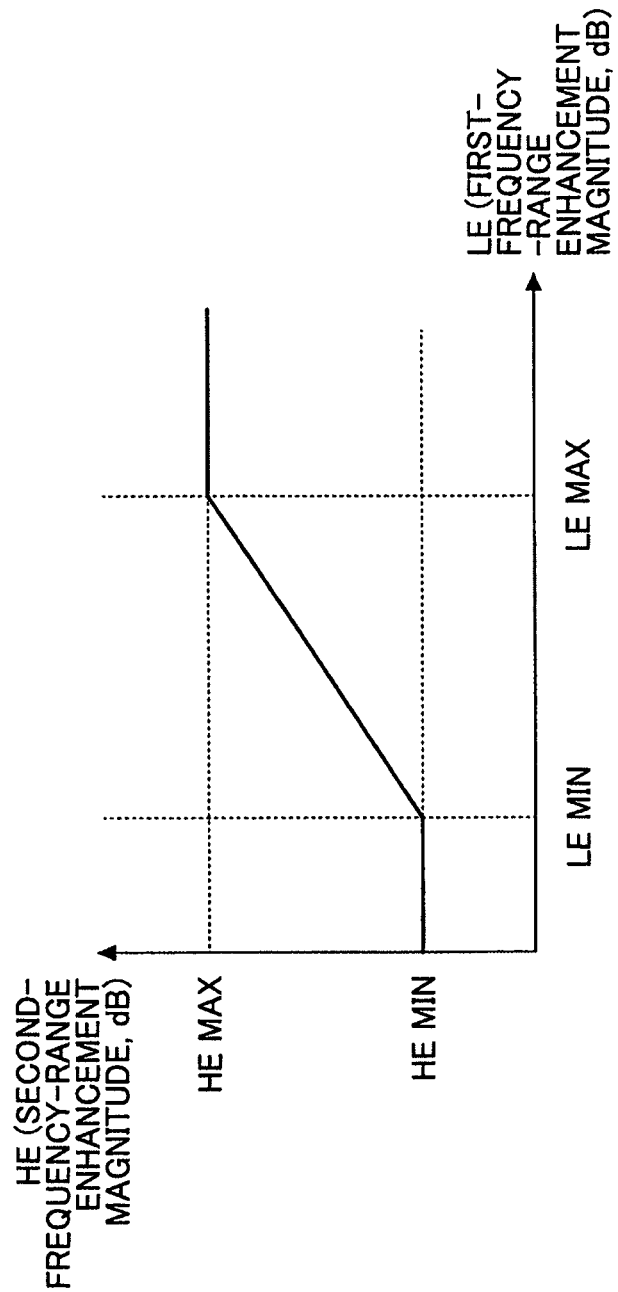
FIG. 7 is a graph for calculating a second-frequency-range enhancement magnitude.

The second-frequency-range enhancement magnitude calculation unit 5 inputs the first-frequency-range enhancement magnitude, and calculates second-frequency-range enhancement magnitude using a graph illustrated in FIG. 7 in the following manner.

$$HE(\text{dB}) = HE\ \text{MIN} + \frac{HE\ \text{MAX} - HE\ \text{MIN}}{LE\ \text{MAX} - LE\ \text{MIN}} * (LE - LE\ \text{MIN}) \quad [\text{Equation 2}]$$

HE: the second-frequency-range enhancement magnitude (dB)

LE: the first-frequency-range enhancement magnitude (dB)

HE MAX: the upper limit of the enhancement magnitude of the second frequency range (dB)

HE MIN: the lower limit of the enhancement magnitude of the second frequency range (dB)

LE MAX: the first-frequency-range enhancement magnitude at which the upper limit of the second-frequency-range enhancement magnitude is obtained (dB)

LE MIN: the first-frequency-range enhancement magnitude at which the lower limit of the second-frequency-range enhancement magnitude is obtained (dB)

The possible range of each parameter of the graph is as follows.

LE MAX: 0 to 50 dB, the upper limit provided so that the enhancement of the first frequency range does not exceed the maximum level if the average SNR of the first frequency range is equal to or less than a predetermined value.

LE MIN: 0 to 10 dB, the lower limit provided so that the enhancement of the first frequency range does not fall short of the minimum level if the average SNR of the first frequency range is equal to or more than a predetermined value.

Note that LE MAX must be larger than LE MIN (LE MIN<LE MAX). (These two parameters are the same as those in FIG. 6).

HE MAX: 0 to 50 dB, the upper limit value of the second-frequency-range enhancement magnitude which is used when the second-frequency-range enhancement magnitude is determined based on the first-frequency-range enhancement magnitude and is provided so that the enhancement of the second frequency range does not exceed the maximum level if the first-frequency-range enhancement magnitude is equal to or greater than a predetermined value.

HE MIN: 0 to 50 dB, the lower limit value of the second-frequency-range enhancement magnitude which is used when the second-frequency-range enhancement magnitude is determined based on the first-frequency-range enhancement magnitude and is provided so that the enhancement of the second frequency range does not fall short of the minimum level if the first-frequency-range enhancement magnitude is equal to or less than a predetermined value.

Note that HE MAX must be larger than HE MIN (HE MIN<HE MAX).

Speech Sound Spectrum Processing Unit 6

The speech sound spectrum processing unit 6 inputs the spectra of the speech sound output from the frequency analysis unit 2, the first-frequency-range enhancement magnitude, the second-frequency-range enhancement magnitude and the frequency-range division information, and calculates the enhancement magnitude for the spectra of the speech sound according to the following process and performs an enhancement process.

Next are described specific examples of the calculation of enhancement magnitude of each frequency component performed by the speech sound spectrum processing unit 6.

<<Specific Example 1 of Calculation of Enhancement Magnitude of Each Frequency Component Performed by Speech Sound Spectrum Processing Unit 6>>

Figure 9:
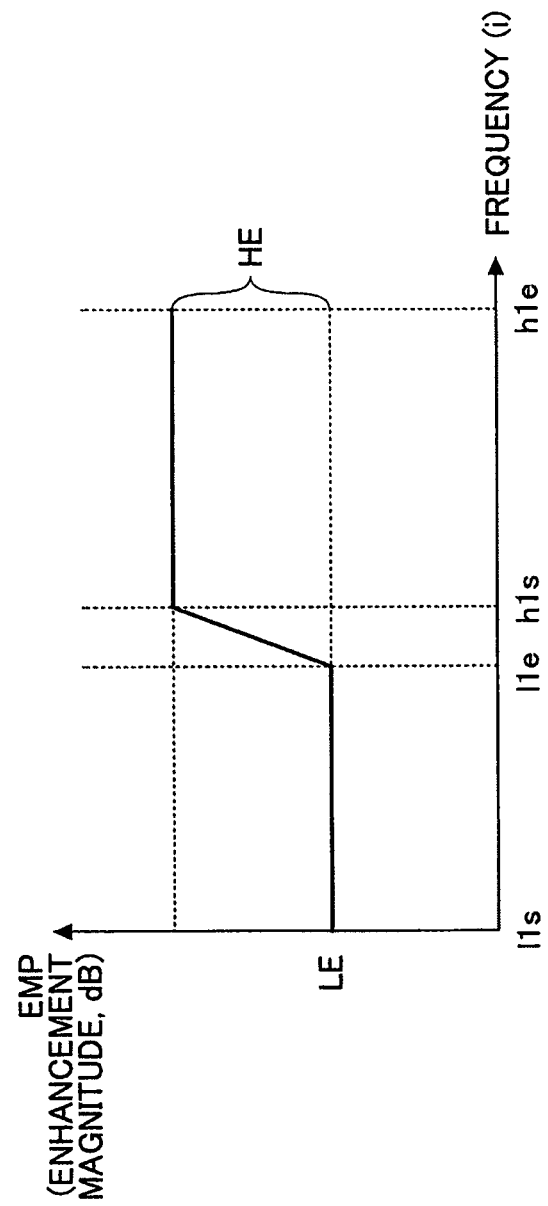
FIG. 9 is a specific example 1 of a graph used for calculating enhancement magnitude of each frequency range.

The enhancement magnitude of each frequency component is calculated using a graph illustrated in FIG. 9.

$$EMP(i) = \begin{cases} LE & i \leq l1e \\ LE + \dfrac{HE}{h1s - l1e} * (i - l1e) & l1e < i < h1s \\ HE & i \geq h1s \end{cases} \quad [\text{Equation 3}]$$

EMP(i): the enhancement magnitude of each frequency component (dB)

i: the frequency index

LE: the first-frequency-range enhancement magnitude (dB)

HE: the second-frequency-range enhancement magnitude (dB)

l1s: the lower limit frequency index of the first frequency range l1e: the upper limit frequency index of the first frequency range h1s: the lower limit frequency index of the second frequency range h1e: the upper limit frequency index of the second frequency range "l1s", "l1e", "h1s" and "h1e" are calculated in the following manner using the frequency-range division information (the boundary frequency index $I_b$ between the first frequency range and the second frequency range) and the frequency range width of the input signal.

l1s=the lower limit frequency index of the frequency range width of the input signal $$l1e = I_b - \psi$$

$$h1s = I_b + \zeta$$

h1e=the upper limit frequency index of the frequency range width of the input signal ψ, ζ: positive values ((value between 1 to 0.5)×ind max)

ind max: the maximum value of the frequency index

ψ and ζ are values for determining a frequency range width, which is provided to prevent occurrence of discontinuity in the enhancement magnitude at the boundary of the frequency ranges.

<<Specific Example 2 of Calculation of Enhancement Magnitude of Each Frequency Component Performed by Speech Sound Spectrum Processing Unit>>

The enhancement magnitude of each frequency component is calculated using a graph illustrated in FIG. 10.

$$EMP(i) = \begin{cases} LE & i \leq l2e \\ LE + (i - l2e) * HE & l2e < i \leq h2e \cap EMP(i) < EMP\ MAX \\ EMP\ MAX & l2e < i \leq h2e \cap EMP(i) \geq EMP\ MAX \end{cases}$$

[Equation 4]

EMP(i): the enhancement magnitude of each frequency component (dB)
   i: the frequency index
   LE: the first-frequency-range enhancement magnitude (dB)
   HE: the second-frequency-range enhancement magnitude (dB)
   EMP MAX: the upper limit of the enhancement magnitude (dB)
   l2s: the lower limit frequency index of the first frequency range
   l2e: the upper limit frequency index of the first frequency range
   h2s: the lower limit frequency index of the second frequency range, h2s=l2e
   h2e: the upper limit frequency index of the second frequency range "h2s", "h2e", "l2s" and "l2e" are calculated in the following manner using the frequency-range division information (the boundary frequency index $I_b$ between the first frequency range and the second frequency range) and the frequency range width of the input signal.

$l2s$=the lower limit frequency index of the frequency range width of the input signal $h2e = I_b$ $l2s = I_b$ $h2e$=the upper limit frequency index of the frequency range width of the input signal Next is described a specific example of spectrum processing for each frequency component performed by the speech sound spectrum processing unit 6.

<<Specific Example of Spectrum Processing for Each Frequency Component Performed by Speech Sound Spectrum Processing Unit>>

First, using the enhancement magnitude of each frequency component EMP(i), the speech sound spectrum processing unit 6 calculates a coefficient emp coef(i) to be applied to the spectra of each frequency component.

$$empcoef(i) = 10^{\frac{EMP(i)}{20}}$$

[Equation 5]

Next, the real part and the imaginary part of the spectra of each frequency component are multiplied by the corresponding coefficient emp coef(i), thereby processing the spectra of each frequency component.

$$ESPEre(i) = SPEre(i) * empcoef(i)$$
$$ESPEim(i) = SPEim(i) * empcoef(i)$$
$$empcoef(i) = 10^{\frac{EMP(i)}{20}}$$

[Equation 6]

EMP(i): the enhancement magnitude of each frequency component (dB)
   i: the frequency index
   SPE re(i): the real part of the spectra of each frequency component
   SPE im(i): the imaginary part of the spectra of each frequency component
   ESPE re(i): the real part of the enhanced spectra of each frequency component
   ESPE im(i): the imaginary part of the enhanced spectra of each frequency component
   emp coef(i): the multiplying factor of the spectra of each frequency component Synthesizing Unit 7

The synthesizing unit 7 inputs the spectra of enhanced speech sound output from the speech sound spectrum processing unit 6, and converts the enhanced speech sound spectra into a time-domain waveform using a frequency-time transform process, such as the inverse Fourier transform method. In this way, the synthesizing unit 7 generates and outputs enhanced speech sound.

Thus, according to the present embodiment, with the processing operation of each structural component, it is possible to generate enhanced speech sound having a sufficient quality in both subjective intelligibility and subjective articulation in the case where the received speech sound becomes hard to listen to due to ambient noise.

Second Embodiment

Figure 2:
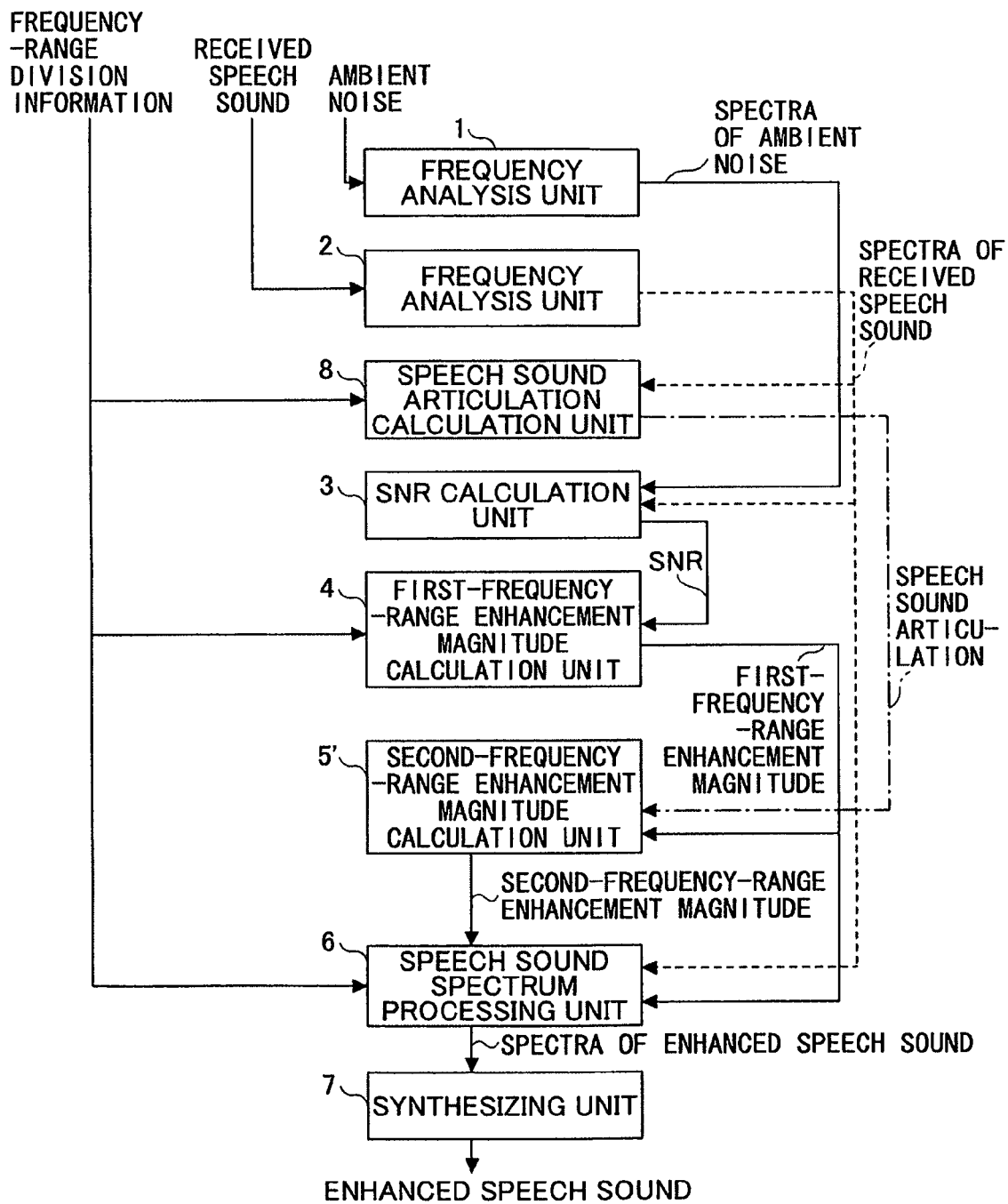
FIG. 2 is an illustration of the second embodiment of the present disclosure.

FIG. 2 is an illustration showing a structure of the second embodiment of the present disclosure, and the same reference numerals are given to the components which are common to those of the first embodiment. Reference numerals 1 and 2 denote the frequency analysis units; reference numeral 3 denotes the SNR calculation unit; reference numeral 4 denotes the first-frequency-range enhancement magnitude calculation unit; reference numeral 5' denotes a second-frequency-range enhancement magnitude calculation unit; reference numeral 6 denotes the speech sound spectrum processing unit; reference numeral 7 is the synthesizing unit; and reference numeral 8 is a speech sound articulation calculation unit.

The structure illustrated in FIG. 2 is explained next according to an audio signal process. The detailed operation of each structural component is described later.

First, the frequency analysis unit 1 inputs ambient noise, and outputs spectra of the ambient noise.

The frequency analysis unit 2 inputs received speech sound, and outputs spectra of the received speech sound.

The speech sound articulation calculation unit 8 inputs the spectra of the received speech sound output from the frequency analysis unit 2 and frequency-range division information, which indicates a preliminarily-obtained frequency range contributing to an improvement of the subjective intelligibility of the received speech sound and a preliminarily-obtained frequency range contributing to an improvement of the subjective articulation of the received speech sound, and then outputs information indicating articulation of the speech sound.

The SNR calculation unit 3 inputs the spectra of the ambient noise and the spectra of the received speech sound from the frequency analysis units 1 and 2, respectively, and calculates and outputs an SNR.

The first-frequency-range enhancement magnitude calculation unit 4 inputs the SNR output from the SNR calculation unit and the frequency-range division information, and then calculates enhancement magnitude applied to the frequency range contributing to the improvement of the subjective intelligibility of the received speech sound and outputs it as first-frequency-range enhancement magnitude.

The second-frequency-range enhancement magnitude calculation unit 5' inputs the first-frequency-range enhancement magnitude and the information indicating articulation of the speech sound output from the speech sound articulation calculation unit 8, and calculates enhancement magnitude applied to the frequency range contributing to the improvement of the subjective articulation of the received speech sound and outputs it as second-frequency-range enhancement magnitude.

The speech sound spectrum processing unit 6 inputs the frequency-range division information, the first-frequency-range enhancement magnitude and the second-frequency-range enhancement magnitude, and outputs spectra of enhanced speech sound.

The synthesizing unit 7 inputs the spectra of enhanced speech sound output from the speech sound spectrum processing unit 6, and outputs enhanced speech sound.

According to the above processing flow, the process for enhancing the received speech sound is performed.

The following describes detailed processing operations of structural components which are different from those of the first embodiment.

Speech Sound Articulation Calculation Unit 8

The speech sound articulation calculation unit 8 inputs the spectra of the received speech sound and the frequency-range division information, and generates and outputs the information indicating articulation of the speech sound according to the following process.

$$C = H - L \quad \text{[Equation 7]}$$

$$H = \sum_{i=h3s}^{h3e} S(i)$$

$$L = \sum_{i=l3s}^{l3e} S(i)$$

C: the articulation of the speech sound (dB)
H: the power of the second frequency range of the received speech sound (dB)
L: the power of the first frequency range of the received speech sound (dB)
i: the frequency index
S(i): the magnitude of a received speech sound component in the i-th frequency component (dB)
l3s: the lower limit frequency index of the first frequency range
l3e: the upper limit frequency index of the first frequency range
h3s: the lower limit frequency index of the second frequency range
h3e: the upper limit frequency index of the second frequency range "h3s", "h3e", "l3s" and "l3e" are calculated in the following manner using the frequency-range division information (the boundary frequency index $I_b$ between the first frequency range and the second frequency range) and th frequency range width of the input signal.

$$h3s = I_b$$

h3e = the upper limit frequency index of the frequency range width of the input signal l3s = the lower limit frequency index of the frequency range width of the input signal $$l3e = I_b - 1$$

Note that, in the articulation calculation, an effect where subjective magnitude of sound changes with respect to each frequency may be introduced.

Specifically, when H and L are calculated, correction is made by multiplying S(i) by a coefficient representing the subjective magnitude of a specific frequency. The coefficient representing the subjective magnitude of a specific frequency is calculated using existing information, such as an equal-loudness curve.

Second-Frequency-Range Enhancement Magnitude Calculation Unit 5'

The second-frequency-range enhancement magnitude calculation unit 5' inputs the first-frequency-range enhancement magnitude and the information indicating articulation of the speech sound, and calculates second-frequency-range enhancement magnitude using the graph illustrated in FIG. 7 in the following manner.

The second-frequency-range enhancement magnitude HE is calculated in a similar manner calculated by the second-frequency-range enhancement magnification calculation unit 5 of the first embodiment.

Figure 8:
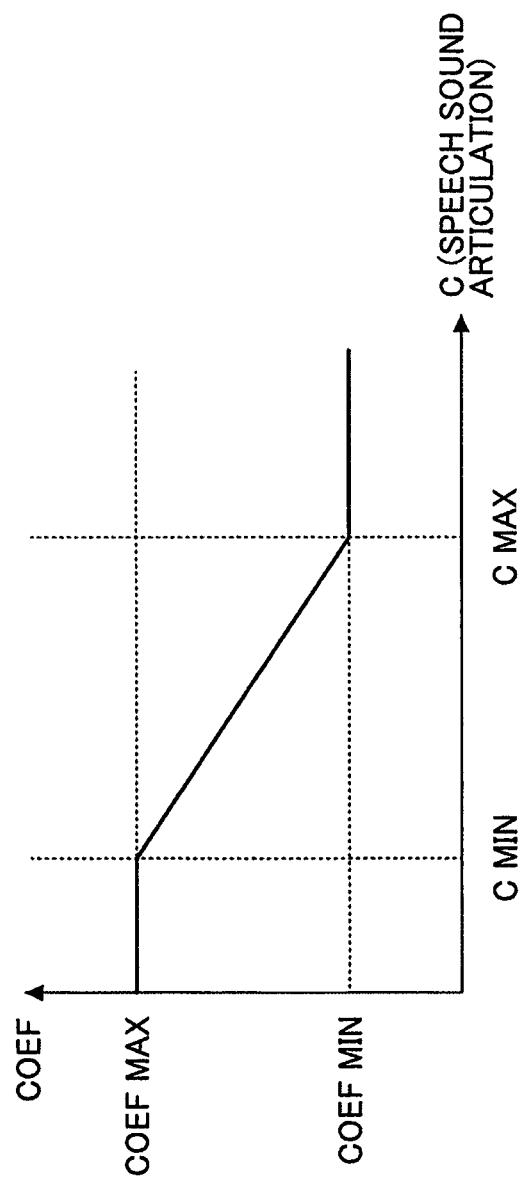
FIG. 8 is a graph for correcting the second-frequency-range enhancement magnitude.

The calculated HE is corrected using a graph illustrated in FIG. 8.

$$COEF = COEF\ \text{MAX} + \frac{COEF\ \text{MIN} - COEF\ \text{MAX}}{LE\ \text{MAX} - LE\ \text{MIN}} * (LE - LE\ \text{MIN}) \quad \text{[Equation 8]}$$

$$HE' = HE *$$

The corrected HE' is newly assigned as the second-frequency-range enhancement magnitude HE.

HE: the second-frequency-range enhancement magnitude (dB)
HE': the corrected second-frequency-range enhancement magnitude obtained using the articulation of the speech sound (dB)
COEF: the coefficient used for correcting the second-frequency-range enhancement magnitude
COEF MAX: the upper limit of the coefficient used for correcting the second-frequency-range enhancement magnitude
COEF MIN: the lower limit of the coefficient used for correcting the second-frequency-range enhancement magnitude
C MAX: the articulation of the speech sound at which the lower limit of the coefficient used for correcting the second-frequency-range enhancement magnitude is obtained (dB)
C MIN: the articulation of the speech sound at which the upper limit of the coefficient used for correcting the second-frequency-range enhancement magnitude is obtained (dB)

The possible range of each parameter of the table is as follows.

COEF MAX: 0 to 1, the upper limit provided so that the coefficient used for correcting the second-frequency-range enhancement magnitude HE does not exceed the maximum level if the articulation of the speech sound is equal to or less than a predetermined value.

COEF MIN: 0 to 1, the lower limit provided so that the coefficient used for correcting the second-frequency-range enhancement magnitude HE does not fall short of the minimum level if the articulation of the speech sound is equal to or greater than a predetermined value.

Note that COEF MAX must be larger than COEF MIN (COEF MIN<COEF MAX).

C MAX: −50 to 50 dB, the upper limit value of the articulation of the speech sound used to determine the coefficient for correcting the second-frequency-range enhancement magnitude.

C MIN: −90 to 0 dB, the lower limit value of the articulation of the speech sound used to determine the coefficient for correcting the second-frequency-range enhancement magnitude.

Note that C MAX must be larger than C MIN (C MIN<C MAX).

In the second embodiment, the speech sound articulation calculation unit 8 is added to the structure of the first embodiment so as to calculate articulation of the speech sound. Accordingly, the second-frequency-range enhancement magnitude calculation unit 5' calculates the second-frequency-range enhancement magnitude, taking into consideration the articulation of the speech sound. As a result, it is possible to adjust the second-frequency-range enhancement magnitude to be small in the case where the articulation of the speech sound is excessive and the enhanced sound is therefore likely to become shrill if the second-frequency-range enhancement magnitude is large. On the other hand, the second-frequency-range enhancement magnitude is adjusted to be large in the case where the level of the articulation of the speech sound is low and the enhanced sound is therefore likely to become muffled if the second-frequency-range enhancement magnitude is small. In this manner, it is possible to prevent the enhanced speech sound from becoming muffled or shrill.

Third Embodiment

Figure 3:
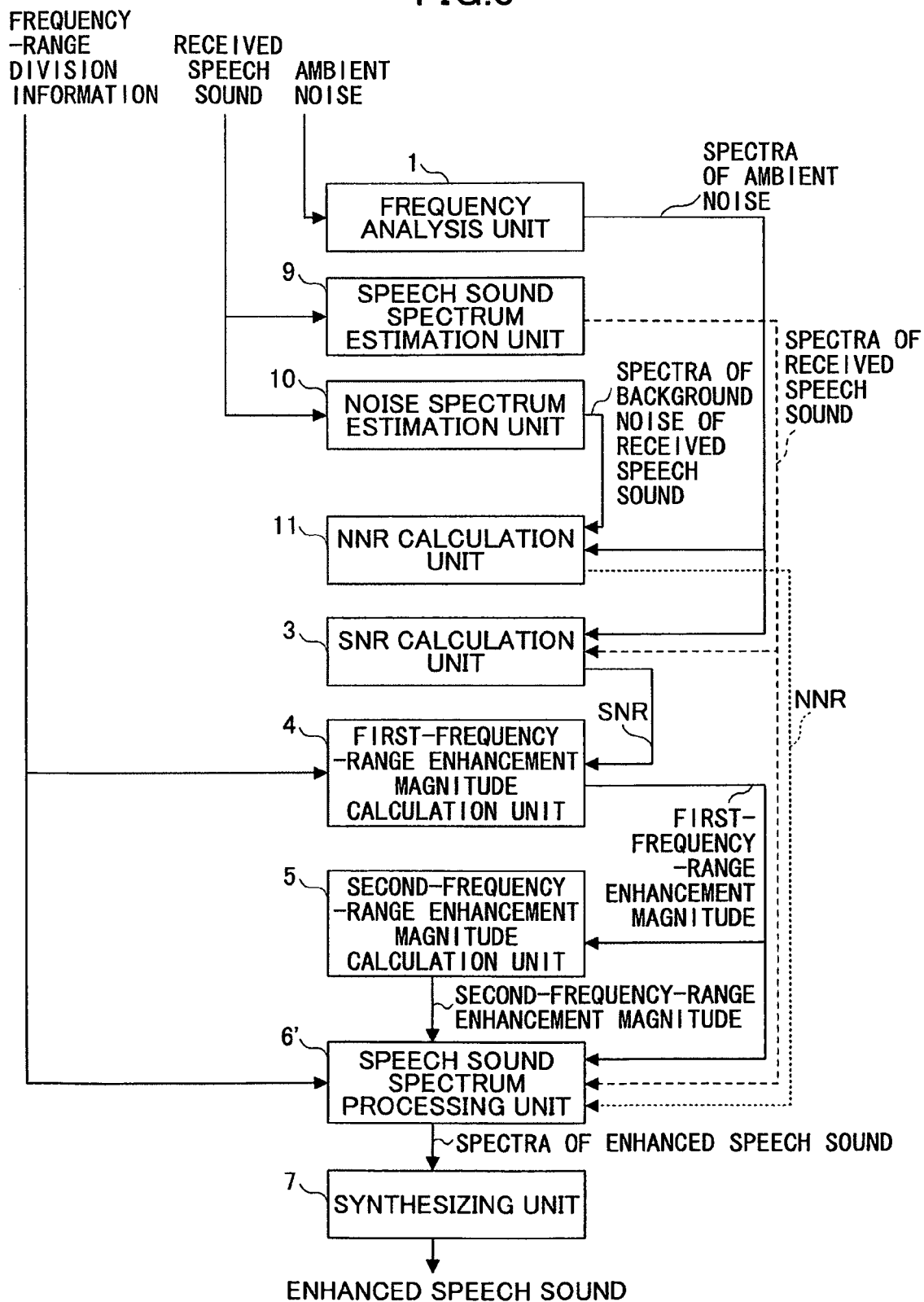
FIG. 3 is an illustration of the third embodiment of the present disclosure.

FIG. 3 is an illustration showing a structure of the third embodiment of the present disclosure, and the same reference numerals are given to the components which are common to those of the first embodiment. Reference numeral 1 denotes the frequency analysis unit; reference numeral 9 denotes a speech sound spectrum estimation unit; reference numeral 10 denotes a noise spectrum estimation unit; reference numeral 11 denotes an NNR calculation unit; reference numeral 3 denotes the SNR calculation unit; reference numeral 4 is the first-frequency-range enhancement magnitude calculation unit; reference numeral 5 denotes the second-frequency-range enhancement magnitude calculation unit; reference numeral 6' denotes the speech sound spectrum processing unit; and reference numeral 7 is the synthesizing unit.

The structure illustrated in FIG. 3 is explained next according to an audio signal process.

The detailed operation of each structural component is described later.

First, the frequency analysis unit 1 inputs ambient noise, and outputs spectra of the ambient noise.

The speech sound spectrum estimation unit 9 inputs received speech sound, and generates and outputs spectra of the received speech sound from which background noise superimposed on the received speech sound has been removed.

The noise spectrum estimation unit 10 inputs the received speech sound, and generates and outputs spectra of the background noise superimposed on the received speech sound.

The NNR calculation unit 11 inputs the spectra of the ambient noise output from the frequency analysis unit 1 and the spectra of the background noise of the received speech sound output from the noise spectrum estimation unit 10, and calculates and outputs an NNR, which is a ratio of ambient noise to background noise superimposed on the speech sound.

The SNR calculation unit 3 inputs the spectra of the ambient noise output from the frequency analysis unit 1 and the spectra of the speech sound, from which background noise has been removed, output from the speech sound spectrum estimation unit 9, and calculates and outputs an SNR.

The first-frequency-range enhancement magnitude calculation unit 4 inputs the SNR output from the SNR calculation unit and frequency-range division information, which indicates a preliminarily-obtained frequency range contributing to an improvement of the subjective intelligibility of the received speech sound and a preliminarily-obtained frequency range contributing to an improvement of the subjective articulation of the received speech sound. Then, the first-frequency-range enhancement magnitude calculation unit 4 calculates enhancement magnitude applied to the frequency range contributing to the improvement of the subjective intelligibility of the received speech sound and outputs it as first-frequency-range enhancement magnitude.

The second-frequency-range enhancement magnitude calculation unit 5 inputs the first-frequency-range enhancement magnitude, and calculates enhancement magnitude applied to the frequency range contributing to the improvement of the subjective articulation of the received speech sound and outputs it as second-frequency-range enhancement magnitude.

The speech sound spectrum processing unit 6' inputs the frequency-range division information, the first-frequency-range enhancement magnitude, the second-frequency-range enhancement magnitude, the NNR and the spectra of the speech sound, and outputs spectra of enhanced speech sound.

The synthesizing unit 7 inputs the spectra of enhanced speech sound output from the speech sound spectrum processing unit 6, and outputs enhanced speech sound.

According to the above processing flow, the process for enhancing the received speech sound is performed.

The following describes detailed processing operations of structural components which are different from those of the first and second embodiments.

Speech Sound Spectrum Estimation Unit 9 and Noise Spectrum Estimation Unit 10

The speech sound spectrum estimation unit 9 and the noise spectrum estimation unit 10 receive the received speech sound, and calculate spectra of the received speech sound and spectra of the background noise superimposed on the received speech sound, respectively.

Specifically, the calculations can be performed using a publickly-known noise suppression technology (refer to Japanese Laid-open Patent Application Publication No. 2005-165021).

For example, an input audio signal, on which noise is superimposed, is analyzed and the spectral amplitude (amplitude spectra) of the audio signal is calculated. Using the calculated spectral amplitude, spectra of the speech sound is estimated. Here, the spectra of the speech sound correspond to, among components of the input audio signal on which noise is superimposed, components without noise—i.e. information representing a pure audio signal.

The spectra of noise are also estimated in a similar manner.

NNR Calculation Unit 11

The NNR calculation unit 11 inputs the spectra of the ambient noise and the spectra of the background noise of the received speech sound, and calculates an NNR, which is a ratio of ambient noise to background noise superimposed on the speech sound, using the following equation and outputs the NNR.

$$NNR(i)=N(i)-N'(i)$$

where i is the frequency index;

NNR(i) is the NNR of the i-th frequency component (dB);

N(i) is the power spectrum of the i-th frequency component (dB); and

N'(i) is the power spectrum of the background noise of the received speech sound in the i-th frequency component (dB).

The frequency index above indicates a number of a frequency range (i.e. frequency component) used in the spectral calculation with the Fourier transform.

Note that, in the NNR calculation, an effect where subjective magnitude of sound changes with respect to each frequency may be introduced.

Specifically, the calculated NNR(i) is corrected by multiplying it by a coefficient representing the subjective magnitude of a specific frequency. The coefficient representing the subjective magnitude of a specific frequency is calculated using existing information, such as an equal-loudness curve.

Speech Sound Spectrum Processing Unit 6'

The speech sound spectrum processing unit 6' inputs the spectra of the speech sound output from the frequency analysis unit 2, the first-frequency-range enhancement magnitude, the second-frequency-range enhancement magnitude, the NNR and the frequency-range division information, and calculates the enhancement magnitude for the spectra of the speech sound according to the following process and performs an enhancement process.

Next is described a specific example of the calculation of enhancement magnitude of each frequency component performed by the speech sound spectrum processing unit 6'.

First, the speech sound spectrum processing unit 6' calculates the enhancement magnitude of each frequency component EMP(i) in the same manner as the speech sound spectrum processing unit 6.

Next, the enhancement magnitude of each frequency component is corrected using the NNR.

The correction of the enhancement magnitude is made in such a manner that after the received speech sound is enhanced, the NNR, which is a ratio of ambient noise and background noise of the received speech sound, does not fall short of a threshold.

$$MOD\ EMP(i)=EMP(i), \text{ when } EMP\ NNR(i) \leq TH\ NNR$$

$$MOD\ EMP(i)=NNR(i)-TH\ NNR, \text{ when } EMP\ NNR(i) > TH\ NNR$$

where EMP(i) is the enhancement magnitude of each frequency component (dB);

MOD EMP(i) is the corrected enhancement magnitude of each frequency component (dB);

NNR(i) is the NNR of each frequency component (dB); and

TH NNR is the lower limit of the NNR (dB).

The possible range of each parameter of the equations is as follows.

TH NNR: −50 to 50 dB, the lower limit of the NNR provided to prevent noise superimposed on the received speech sound from becoming disagreeable to the ear due to the enhancement.

Next, using the corrected enhancement magnitude of each frequency component MOD EMP(i), the speech sound spectrum processing unit 6' calculates a coefficient emp coef(i) to be applied to the spectra of each frequency component.

$$empcoef(i) = 10^{\frac{MOD\ EMP(i)}{20}} \qquad \text{[Equation 9]}$$

Next, the real part and the imaginary part of the spectra of each frequency component are multiplied by the corresponding coefficient emp coef(i), thereby processing the spectra of each frequency component.

$$ESPE\text{re}(i) = SPE\text{re}(i) * empcoef(i) \qquad \text{[Equation 10]}$$
$$ESPE\text{im}(i) = SPE\text{im}(i) * empcoef(i)$$
$$empcoef(i) = 10^{\frac{EMP(i)}{20}}$$

MOD EMP(i): the corrected enhancement magnitude of each frequency component (dB)

i: the frequency index

SPE re(i): the real part of the spectra of each frequency component

SPE im(i): the imaginary part of the spectra of each frequency component

ESPE re(i): the real part of the enhanced spectra of each frequency component

ESPE im(i): the imaginary part of the enhanced spectra of each frequency component emp coef(i): the multiplying factor of the spectra of each frequency component In the third embodiment, the NNR calculation unit 11 is added to the structure of the first embodiment so as to calculate an NNR, which is a ratio of ambient noise to background noise superimposed on the speech sound. Accordingly, the speech sound spectrum processing unit 6' calculates the second-frequency-range enhancement magnitude, taking into consideration the NNR. As a result, it is possible to control the enhancement magnitude so that the background noise of the speech sound does not become excessive after the enhancement.

Fourth Embodiment

Figure 4:
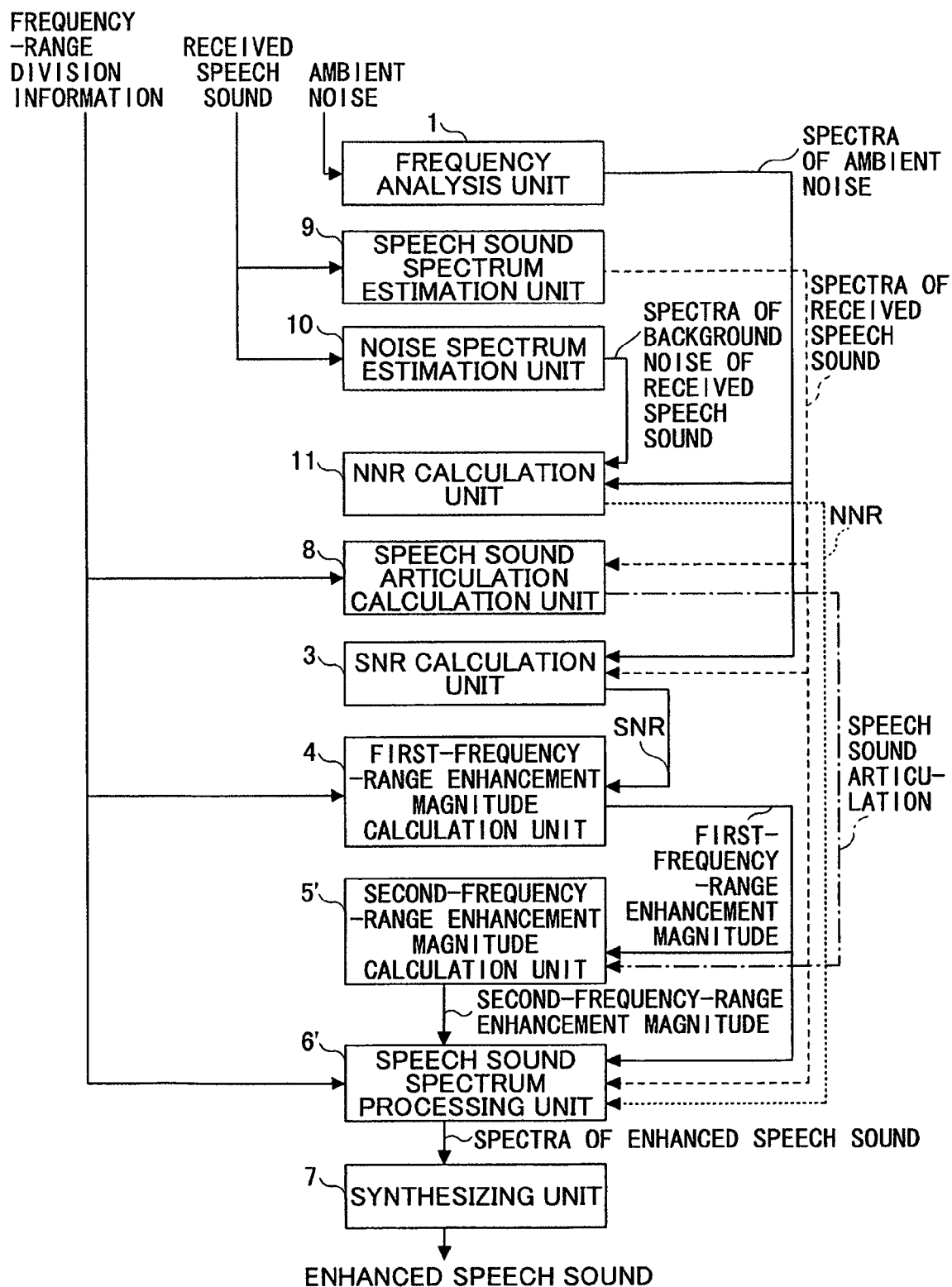
FIG. 4 is an illustration of the fourth embodiment of the present disclosure.
Figure 5:
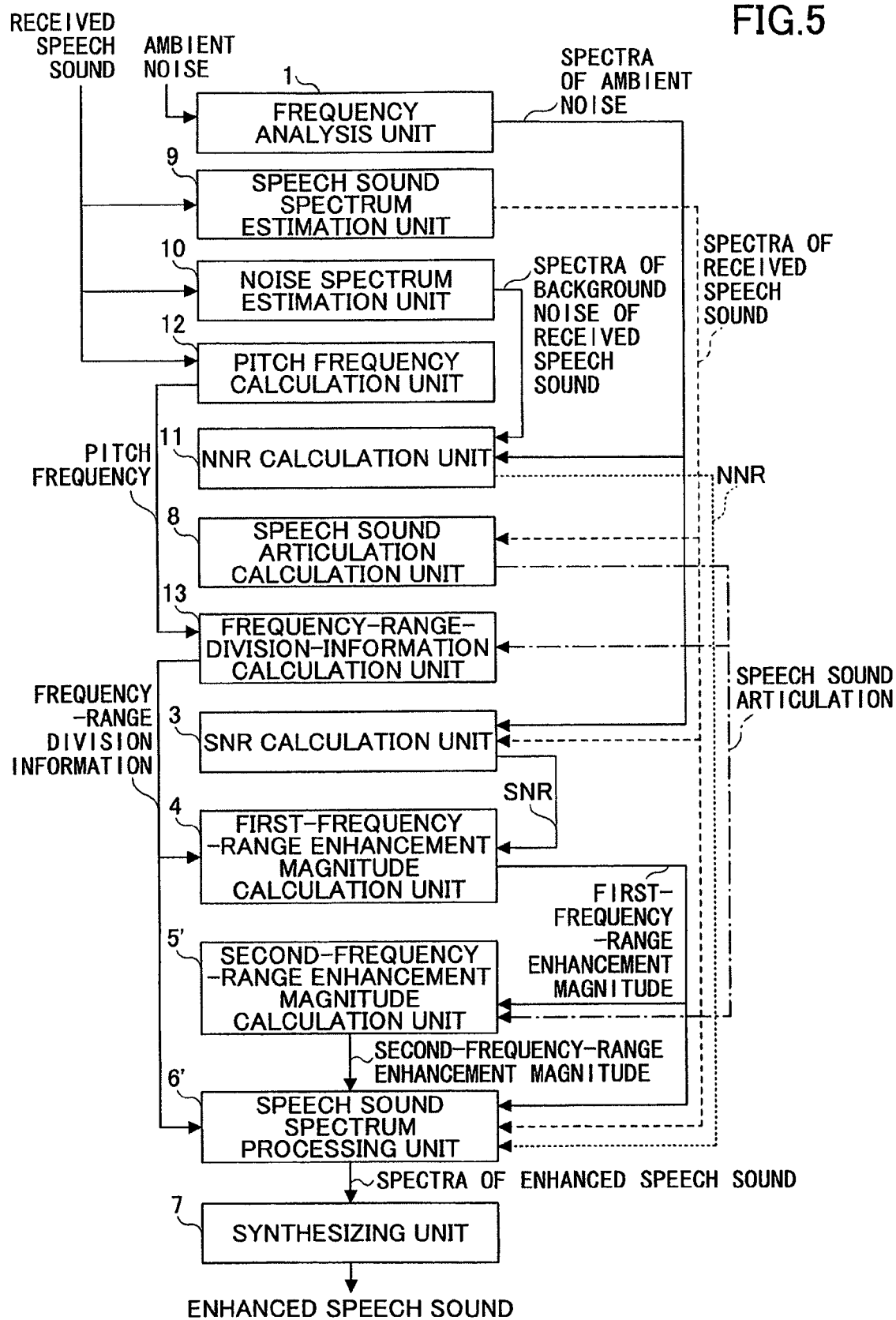
FIG. 5 is an illustration of the fifth embodiment of the present disclosure.

FIG. 4 is an illustration showing a structure of the fourth embodiment of the present disclosure, and the same reference numerals are given to the components which are common to those of the first embodiment. Reference numeral 1 denotes the frequency analysis unit; reference numeral 9 denotes the speech sound spectrum estimation unit; reference numeral 10 denotes the noise spectrum estimation unit; reference numeral 11 denotes the NNR calculation unit; reference numeral 8 denotes the speech sound articulation calculation unit; reference numeral 3 denotes the SNR calculation unit; reference numeral 4 is the first-frequency-range enhancement magnitude calculation unit; reference numeral 5' denotes the second-frequency-range enhancement magnitude calculation unit; reference numeral 6' denotes the speech sound spectrum processing unit; and reference numeral 7 is the synthesizing unit.

The structure illustrated in FIG. 4 is explained next according to an audio signal process. The detailed operation of each structural component is described later.

First, the frequency analysis unit 1 inputs ambient noise, and outputs spectra of the ambient noise.

The speech sound spectrum estimation unit 9 inputs received speech sound, and generates and outputs spectra of the received speech sound from which background noise superimposed on the received speech sound has been removed.

The noise spectrum estimation unit 10 inputs the received speech sound, and generates and outputs spectra of the background noise superimposed on the received speech sound.

The NNR calculation unit 11 inputs the spectra of the ambient noise output from the frequency analysis unit 1 and the spectra of the background noise of the received speech sound output from the noise spectrum estimation unit 10, and calculates and outputs an NNR, which is a ratio of ambient noise to background noise superimposed on the speech sound.

The speech sound articulation calculation unit 8 inputs the spectra of the received speech sound output from the frequency analysis unit 2 and frequency-range division information, which indicates a preliminarily-obtained frequency range contributing to an improvement of the subjective intelligibility of the received speech sound and a preliminarily-obtained frequency range contributing to an improvement of the subjective articulation of the received speech sound, and then outputs information indicating articulation of the speech sound.

The SNR calculation unit 3 inputs the spectra of the ambient noise output from the frequency analysis unit 1 and the spectra of the speech sound, from which background noise has been removed, output from the speech sound spectrum estimation unit 9, and calculates and outputs an SNR.

The first-frequency-range enhancement magnitude calculation unit 4 inputs the SNR output from the SNR calculation unit and frequency-range division information, which indicates a preliminarily-obtained frequency range contributing to an improvement of the subjective intelligibility of the received speech sound and a preliminarily-obtained frequency range contributing to an improvement of the subjective articulation of the received speech sound. Then, the first-frequency-range enhancement magnitude calculation unit 4 calculates enhancement magnitude applied to the frequency range contributing to the improvement of the subjective intelligibility of the received speech sound and outputs it as first-frequency-range enhancement magnitude.

The second-frequency-range enhancement magnitude calculation unit 5' inputs the first-frequency-range enhancement magnitude and the information indicating articulation of the speech sound, and calculates enhancement magnitude applied to the frequency range contributing to the improvement of the subjective articulation of the received speech sound and outputs it as second-frequency-range enhancement magnitude.

The speech sound spectrum processing unit 6' inputs the frequency-range division information, the first-frequency-range enhancement magnitude, the second-frequency-range enhancement magnitude, the NNR and the spectra of the speech sound, and outputs spectra of enhanced speech sound.

The synthesizing unit 7 inputs the spectra of enhanced speech sound output from the speech sound spectrum processing unit 6, and outputs enhanced speech sound.

According to the above processing flow, the process for enhancing the received speech sound is performed.

The structure of the present embodiment is achieved by combining structural components of the second and third embodiments which are modified from those of the first embodiment. The processing operations of respective structural components of the present embodiments are as described in the first through third embodiments.

Fifth Embodiment

The fifth embodiment is an example where a structure for calculating frequency-range division information, which indicates a frequency range contributing to an improvement of the subjective intelligibility of the received speech sound and a frequency range contributing to an improvement of the subjective articulation of the received speech sound, is added to the speech sound enhancement device of the fourth embodiment. Added structural components are a pitch frequency calculation unit 12 configured to input received speech sound and calculate and output a pitch frequency; and a frequency-range-division-information calculation unit 13 configured to input the pitch frequency and information indicating articulation of the speech sound and generate the frequency-range division information.

The speech sound enhancement process of the present embodiment is the same as that of the fourth embodiment, except for generating the frequency-range division information in the speech sound enhancement device.

The following describes structures of the added structural components of the fifth embodiment in detail.

The pitch frequency calculation unit 12 inputs the received speech sound and calculates a pitch frequency according to the following equations.

$$\text{corr}(a) = \frac{\sum_{i=0}^{M-1} x(i-a)x(i)}{\sqrt{\sum_{i=0}^{M-1} x(i-a)^2} \sqrt{\sum_{i=0}^{M-1} x(i)^2}} \quad \text{[Equation 11]}$$

pitch=freq/$a$ max x: the input signal

M: the length of a period for which a correlation coefficient is calculated (sample)

a: the start position of a signal for which the correlation coefficient is calculated pitch: the pitch frequency (Hz)

corr(a): the correlation coefficient when the shifted position is a a max: a corresponding to the maximum correlation coefficient i: the frequency index of the signal (sample)

freq: the sampling frequency (Hz)

The frequency-range-division-information calculation unit 13 inputs the pitch frequency and the information indicating articulation of the speech sound, and generates frequency-range division information according to one of the following methods.

<<Specific Example 1 of Calculation of Frequency-Range Division Information Performed by Frequency-Range-Division-Information Calculation Unit 13>>

In the specific example 1, the frequency-range division information is calculated in the following order.

(a) The pitch frequency of the received speech sound is calculated.

(b) The frequency-range division information is calculated.

The calculation method is described next in detail.

The boundary frequency index $I_b$ between the first and second frequency ranges is calculated by the following equation. Reference values are provided for $I_s$ and $P_s$. The higher the pitch frequency of the received speech is, the more likely the enhanced speech sound becomes shrill if the second frequency range of the received speech is enhanced. Accordingly, as the pitch frequency of the received speech becomes higher than its reference value, a larger value is assigned to $I_b$. In this way, the higher the pitch frequency of the received speech is, the higher the lower limit frequency index of the second frequency range is raised. As a result, the width of the second frequency range becomes narrow, whereby it is possible to prevent the enhanced speech sound from becoming shrill when the enhancement is performed.

$$I_b = I_s + \alpha(p - p_s)$$

$I_s$: the reference value of the boundary frequency index between the first and second frequency ranges $I_b$: the boundary frequency index between the first and second frequency ranges p: the pitch frequency of the received speech sound $p_s$: the reference value of the pitch frequency of the received speech sound (50 to 500 Hz)

α: positive value

The parameters $P_s$ and α should be in the following range.

$P_s$: 50 to 500 Hz, the pitch of normal voice

α: 0 to 1, the contribution rate of the pitch frequency used to determine $I_b$ based on a shift of the pitch of the received speech sound from the pitch of normal voice <<Specific Example 2 of Calculation of Frequency-Range Division Information Performed by Frequency-Range-Division-Information Calculation Unit 13

In the specific example 2, the frequency-range division information is calculated in the following order.

(a) The power spectrum of the received speech sound is calculated.

(b) The frequency-range division information is calculated.

The calculation method is described next in detail.

The boundary frequency index $I_b$ between the first and second frequency ranges is calculated by the following equation. Reference values are provided for $I_s$ and $p_s$. The smaller the slope of the power spectrum of the received speech sound is, the more likely the enhanced speech sound becomes shrill if the second frequency range of the received speech is enhanced. Accordingly, as the slope of the power spectrum of the received speech sound becomes smaller than its reference value, a larger value is assigned to $I_b$. In this way, the smaller the slope of the power spectrum of the received speech sound is, the higher the lower limit frequency index of the second frequency range is raised. As a result, the width of the second frequency range becomes narrow, whereby it is possible to prevent the enhanced speech sound from becoming shrill when the enhancement is performed.

$$I_b = I_s + \beta(q - q_s)$$

$I_s$: the reference value of the boundary frequency index between the first and second frequency ranges $I_b$: the boundary frequency index between the first and second frequency ranges q: the slope of the power spectrum of the received speech sound $q_s$: the reference value of the slope of the power spectrum of the received speech sound β: negative value The parameters $q_s$ and β should be in the following range.

$q_s$: 50 to 500 Hz, the range of pitch of normal voice

β: −100 to 0, the contribution rate of the slope of the power spectrum of the received speech sound used to determine $I_b$ based on a shift of the slope of the power spectrum of the received speech sound from the slope of the power spectrum of normal voice <<Specific Example 3 of Calculation of Frequency-Range Division Information Performed by Frequency-Range-Division-Information Calculation Unit 13>>

In the specific example 3, the frequency-range division information is calculated in the following order.

(a) The pitch frequency of the received speech sound is calculated.

(b) The power spectrum of the received speech sound is calculated.

(c) The frequency-range division information is calculated.

The calculation method is described next in detail.

The boundary frequency index $I_b$ between the first and second frequency ranges is calculated by the following equation. Reference values are provided for $I_s$, $p_s$ and $q_s$. The higher the pitch frequency of the received speech sound is and the smaller the slope of the power spectrum of the received speech sound is, the more likely the enhanced speech sound becomes shrill if the second frequency range of the received speech is enhanced. Accordingly, as the pitch frequency of the received speech sound becomes higher than the pitch-frequency reference value and as the slope of the power spectrum of the received speech sound becomes smaller than the power-spectrum-slope reference value, a larger value is assigned to $I_b$. In this way, the higher the pitch frequency of the received speech sound is and the smaller the slope of the power spectrum of the received speech sound is, the higher the lower limit frequency index of the second frequency range is raised. As a result, the width of the second frequency range becomes narrow, whereby it is possible to prevent the enhanced speech sound from becoming shrill when the enhancement is performed.

$$I_b = I_s + \alpha(p - p_s) + \beta(q - q_s)$$

$I_s$: the reference value of the boundary frequency index between the first and second frequency ranges $I_b$: the boundary frequency index between the first and second frequency ranges p: the pitch frequency of the received speech sound $p_s$: the reference value of the pitch frequency (the pitch-frequency reference value) of the received speech sound α: positive value q: the slope of the power spectrum of the received speech sound $q_s$: the reference value of the slope of the power spectrum (the power-spectrum-slope reference value) of the received speech sound β: negative value These possible ranges of the parameters are the same as those in the specific examples 1 and 2 of the present embodiment.

The "slope of the power spectrum" of the above specific examples 1 through 3 is calculated in the following manner.

(1) The power spectrum is calculated by the following equation using the spectra.

$$PSP(i) = 10 \log 10(Sp\ re(i) * SP\ re(i) + SP\ im(i) * SP\ im(i))$$

PSP(i): the power spectrum i: the frequency index

SP re(i): the real part of the spectra

SP im(i): the imaginary part of the spectra (2) The slope of the power spectrum is calculated.

The power spectrum for each frequency index is expressed as (I, PSP(i)), and the slope of the power spectrum is calculated by applying a linear function using the least squares method.

The fifth embodiment above is described as an example where the structural components unique to the fifth embodiment are added to the structure of the fourth embodiment. However, by adding the structural components unique to the fifth embodiment to the structure of any of the first through third embodiments, the frequency-range division information can be generated from the received speech sound in a similar fashion.

Thus, in addition to the effects achieved by the first through fourth embodiments, the fifth embodiment is able to control the first and second frequency ranges according to the speech sound by causing the frequency-range-division-information calculation unit 13 to calculate frequency-range division information using the received speech sound. Accordingly, it is possible to achieve adequate speech sound enhancement control according to speech sound.

Note that the frequency-range division information used in the first through fourth embodiments can be statistically obtained as a frequency range that contributes to an improvement of the subjective intelligibility of the received speech sound and a frequency range that contributes to an improvement of the subjective articulation of the received speech sound. Thus, the obtained results may be used as the frequency-range division information.

In addition, a first-frequency-range enhancement unit and a second-frequency-range enhancement unit may be provided so as to perform the speech sound enhancement only in frequency ranges preliminarily specified by the frequency-range division information. In this case, the input pathway of the frequency-range division information is unnecessary, and the same effects as those of the first through fourth embodiments above can be achieved.

In summary, according to one aspect of the present embodiment, in the case where the received speech sound becomes hard to hear due to ambient noise, enhanced speech sound is generated having a sufficient quality in both subjective intelligibility and articulation, and is therefore able to solve the problems of the conventional speech sound enhancement technologies-muffled speech sound (i.e. as a result of the speech sound enhancement, the magnitude of a frequency range contributing to an improvement of the subjective articulation of the received speech sound is too small compared with the magnitude of a frequency range contributing to an improvement of the subjective intelligibility of the received speech sound, and therefore, the enhanced speech sound lacks articulation) and shrill speech sound (as a result of the speech sound enhancement, the magnitude of the frequency range contributing to an improvement of the subjective articulation of the received speech sound is too large compared with the magnitude of the frequency range contributing to an improvement of the subjective intelligibility of the received speech sound, and therefore, articulation becomes excessive in the enhanced speech sound). Accordingly, it is possible to generate the enhanced speech sound easy to listen to.

All examples and conditional language used herein are intended for pedagogical purposes to aid the reader in understanding the present disclosure and the concepts contributed by the inventor to furthering the art, and are to be construed as being without limitation to such specifically recited examples and conditions, nor does the organization of such examples in the specification relate to a showing of the superiority or inferiority of the present disclosure. Although the embodiments of the present disclosure have been described in detail, it should be understood that various changes, substitutions, and alterations could be made hereto without departing from the spirit and scope of the present disclosure.

What is claimed is:

1. A speech sound enhancement device comprising:
   an SNR calculation unit configured to calculate an SNR which is a ratio of received speech sound to ambient noise;
   a first calculation unit configured to calculate, based on the SNR and frequency-range division information that indicates a first frequency range and a second frequency range, an enhancement magnitude of the first frequency range in a case in which the received speech sound is masked by the ambient noise, the first frequency range contributing to an improvement of subjective intelligibility of the received speech sound, the second frequency range contributing to an improvement of subjective articulation of the received speech sound;
   a second calculation unit configured to calculate an enhancement magnitude of the second frequency range based on the enhancement magnitude of the first frequency range;
   a spectrum processing unit configured to process spectra of the received speech sound using the enhancement magnitude of the first frequency range, the enhancement magnitude of the second frequency range and the frequency-range division information; and
   a third calculation unit configured to calculate articulation of the received speech sound based on at least one of a pitch frequency of the received speech sound and a power spectrum of the received speech sound,
   wherein the second calculation unit calculates the enhancement magnitude of the second frequency range based on the enhancement magnitude of the first frequency range and the calculated articulation of the received speech sound, and
   wherein the spectrum processing unit processes the spectra of the received speech sound using the enhancement magnitude of the first frequency range and the enhancement magnitude of the second frequency range.

2. The speech sound enhancement device as claimed in claim 1, further comprising:
   a fourth calculation unit configured to calculate, based on at least one of a pitch frequency of the received speech sound and a high-frequency-range contribution of the received speed sound, the frequency-range division information in the case in which the received speech sound is masked by the ambient noise.

3. The speech sound enhancement device as claimed in claim 1, wherein the third calculation unit calculates the articulation of the speed sound by taking into account an effect of subjective magnitude of sound changing with respect to frequency.

4. The speech sound enhancement device as claimed in claim 1, wherein the SNR calculation unit calculates the SNR by taking into account an effect of subjective magnitude of sound changing with respect to each frequency.

5. The speech sound enhancement device as claimed in claim 1, wherein an upper limit of the first frequency range is 3000 Hz or lower.

6. The speech sound enhancement device as claimed in claim 1, wherein a lower limit of the second frequency range is 500 Hz or lower.

7. The speech sound enhancement device as claimed in claim 1, wherein the first frequency range and the second frequency range are obtained in advance.

8. The speech sound enhancement device as claimed in claim 1, comprising:

a synthesizing unit configured to input the spectra of enhanced speech sound output from the spectrum processing unit, and output enhanced speech sound.

9. The speech sound enhancement device as claimed in claim 8, wherein the synthesizing unit converts the spectra of the enhanced speech sound into a time-domain waveform using a frequency-time transform process.

10. A speech sound enhancement device comprising:
an SNR calculation unit configured to calculate an SNR which is a ratio of received speech sound to ambient noise;
a first calculation unit configured to calculate, based on the SNR and frequency-range division information that indicates a first frequency range and a second frequency range, an enhancement magnitude of the first frequency range in a case in which the received speech sound is masked by the ambient noise, the first frequency range contributing to an improvement of subjective intelligibility of the received speech sound, the second frequency range contributing to an improvement of subjective articulation of the received speech sound;
a second calculation unit configured to calculate an enhancement magnitude of the second frequency range based on the enhancement magnitude of the first frequency range;
a spectrum processing unit configured to process spectra of the received speech sound using the enhancement magnitude of the first frequency range, the enhancement magnitude of the second frequency range and the frequency-range division information; and
an NNR calculation unit configured to calculate an NNR which is a ratio of the ambient noise to background noise superimposed on the received speech sound,
wherein the second calculation unit calculates the enhancement magnitude of the second frequency range based on the enhancement magnitude of the first frequency range and the NNR, and
wherein the spectrum processing unit processes the spectra of the received speech sound using the enhancement magnitude of the first frequency range and the enhancement magnitude of the second frequency range.

11. The speech sound enhancement device as claimed in claim 10, wherein the NNR calculation unit calculates the NNR by taking into account an effect of subjective magnitude of sound changing with respect to frequency.

12. A speech sound enhancement device comprising:
an SNR calculation unit configured to calculate an SNR which is a ratio of received speech sound to ambient noise;
a first calculation unit configured to calculate, based on the SNR and frequency-range division information that indicates a first frequency range and a second frequency range, an enhancement magnitude of the first frequency range in a case in which the received speech sound is masked by the ambient noise, the first frequency range contributing to an improvement of subjective intelligibility of the received speech sound, the second frequency range contributing to an improvement of subjective articulation of the received speech sound;
a second calculation unit configured to calculate an enhancement magnitude of the second frequency range based on the enhancement magnitude of the first frequency range;
a spectrum processing unit configured to process spectra of the received speech sound using the enhancement magnitude of the first frequency range, the enhancement magnitude of the second frequency range and the frequency-range division information;
a third calculation unit configured to calculate articulation of the received speech sound based on at least one of a pitch frequency of the received speech sound and a power spectrum of the received speech sound; and
an NNR calculation unit configured to calculate an NNR which is a ratio of the ambient noise to background noise superimposed on the received speech sound,
wherein the second calculation unit calculates the enhancement magnitude of the first frequency range based on the SNR, the second-frequency-range enhancement magnitude calculation unit calculates the enhancement magnitude of the second frequency range based on the enhancement magnitude of the first frequency range, the NNR and the calculated articulation of the received speech, and
wherein the spectrum processing unit processes the spectra of the received speech sound using the enhancement magnitude of the first frequency range and the enhancement magnitude of the second frequency range.

13. The speech sound enhancement device as claimed in claim 12, wherein the third calculation unit calculates the articulation of the speed sound by taking into account an effect of subjective magnitude of sound changing with respect to frequency.

14. The speech sound enhancement device as claimed in claim 12, wherein the NNR calculation unit calculates the NNR by taking into account an effect where subjective magnitude of sound changing with respect to frequency.

* * * * *